(12) United States Patent
Na (10) Patent No.: US 7,800,957 B2
(45) Date of Patent: Sep. 21, 2010

(54) DATA OUTPUT CIRCUIT IN SEMICONDUCTOR MEMORY APPARATUS

(75) Inventor: Kwang-Jin Na, Ichon (KR)

(73) Assignee: Hynix Semiconductor Inc. (KR)

( * ) Notice: Subject to any disclaimer, the term of this patent is extended or adjusted under 35 U.S.C. 154(b) by 127 days.

(21) Appl. No.: 12/173,724

(22) Filed: Jul. 15, 2008

(65) Prior Publication Data
US 2009/0168548 A1   Jul. 2, 2009

(30) Foreign Application Priority Data
Dec. 27, 2007 (KR) .................. 10-2007-0138418

(51) Int. Cl.
*G11C 16/04* (2006.01)
(52) U.S. Cl. .................. 365/189.05; 365/233.1; 365/230.06
(58) Field of Classification Search ............ 365/189.05, 365/233.1, 230.06, 193
See application file for complete search history.

(56) References Cited

U.S. PATENT DOCUMENTS

| 6,381,194 | B2 | 4/2002 | Li | |
| 6,870,776 | B2 * | 3/2005 | Kim et al. | .............. 365/189.05 |
| 7,057,943 | B2 | 6/2006 | Lee | |
| 7,301,827 | B2 * | 11/2007 | Anzai et al. | ............ 365/189.05 |

FOREIGN PATENT DOCUMENTS

| KR | 1020010004375 A | 1/2001 |
| KR | 1020040037837 A | 5/2004 |

\* cited by examiner

*Primary Examiner*—David Lam
(74) *Attorney, Agent, or Firm*—Baker & McKenzie LLP (57) ABSTRACT

A data output circuit in a semiconductor memory apparatus includes a first data driving unit configured to generate a first driving data at a first timing, a first buffering unit configured to generate a first output data by buffering the first driving data, a second data driving unit configured to generate a second driving data at a second timing that is different from the first timing, and a second buffering unit configured to generate a second output data by buffering the second driving data.

24 Claims, 5 Drawing Sheets

DATA OUTPUT CIRCUIT IN SEMICONDUCTOR MEMORY APPARATUS

CROSS-REFERENCE TO RELATED PATENT APPLICATION

This application claims the benefit under 35 U.S.C. 119(a) of Korean Application No. 10-2007-0138418, filed on Dec. 27, 2007, in the Korean Intellectual Property Office, the disclosure of which is incorporated herein in its entirety by reference as if set forth in full.

BACKGROUND

1. Technical Field

The descriptions herein relate to a semiconductor memory apparatus, particularly a data output circuit in a semiconductor memory apparatus.

2. Related Art

In general, an advanced semiconductor memory apparatus, such as DDR SDRAM (Double Data Rate SDRAM) has improved input/output speed by inputting/outputting data in synchronization with a rising edge and a falling edge of an external clock signal. Accordingly, the semiconductor memory apparatus generates a clock signal (hereafter, rising clock signal) that is enabled on a rising edge of an external clock signal and a clock signal (hereafter, a falling clock signal) that is enabled on a falling edge of the external clock signal, and using a DLL (Delay Locked Loop) circuit in outputting data.

The semiconductor memory apparatus outputs data at a high speed by storing a plurality of data (hereafter, rising data) that is output when the rising clock signal is enabled and a plurality of data (hereafter, falling data) that is output when the falling clock signal is enabled and outputting sequentially the stored data using a pipe register.

Such a conventional semiconductor memory apparatus includes a plurality of data buffers and a plurality of data strobe clock signal buffers. The data buffers and the data strobe clock signal buffers make the output timings of the output data and the data strobe clock signals correspond with each other, respectively, using the rising clock signal and the falling clock signal. However, a large number of data buffers and data strobe clock signal buffers, which operate as described above, are disposed in a data output circuit. Therefore, when the data buffers and the data strobe buffers simultaneously operate at a certain time, the amount of power that is used by the data output circuit increases considerably. This phenomenon increases the entire power noise and reduces the power efficiency of the semiconductor memory apparatus. Research related to operating a semiconductor memory apparatus using low power has been increasing, such that the above problem, which had not been significantly considered previously, is now realized to be an important factor for the power efficiency of semiconductor memory apparatus.

SUMMARY

A data output circuit in a semiconductor memory apparatus that prevents a power noise is described herein.

According to one aspect, a data output circuit in a semiconductor memory apparatus can include a first data driving unit configured to generate a first driving data with a first timing, a first buffering unit configured to generate a first output data by buffering the first driving data signal, a second data driving unit configured to generate a second driving data signal with a second timing that is different from the first timing, and a second buffering unit configured to generate a second output data by buffering the second driving data signal.

A data output circuit in a semiconductor memory apparatus according to another aspect can include a timing control signal generating unit configured to generate first and second timing control signals, a first data driving unit configured to generate a first driving data, using an internal clock signal and a first global line data signal, in response to the first timing control signal, a first buffering unit configured to generate a first output data signal by buffering the first driving data signal, a second data driving unit configured to generate a second driving data signal, using the internal clock signal and a second global line data signal, in response to the second timing control signal, and a second buffering unit configured to generate a second output data signal by buffering the second driving data signal.

A data output circuit in a semiconductor memory apparatus according to still another aspect can include a timing control signal generating unit configured to generate a timing control signal having a plurality of bits, a timing controlling section configured to generate a timing control clock signal by controlling a timing of an internal clock signal in response to the timing control signal, and a data driver configured to generate a driving data signal by sequentially driving, one bit at time, a data signal having a plurality of bits, in response to the timing control clock signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
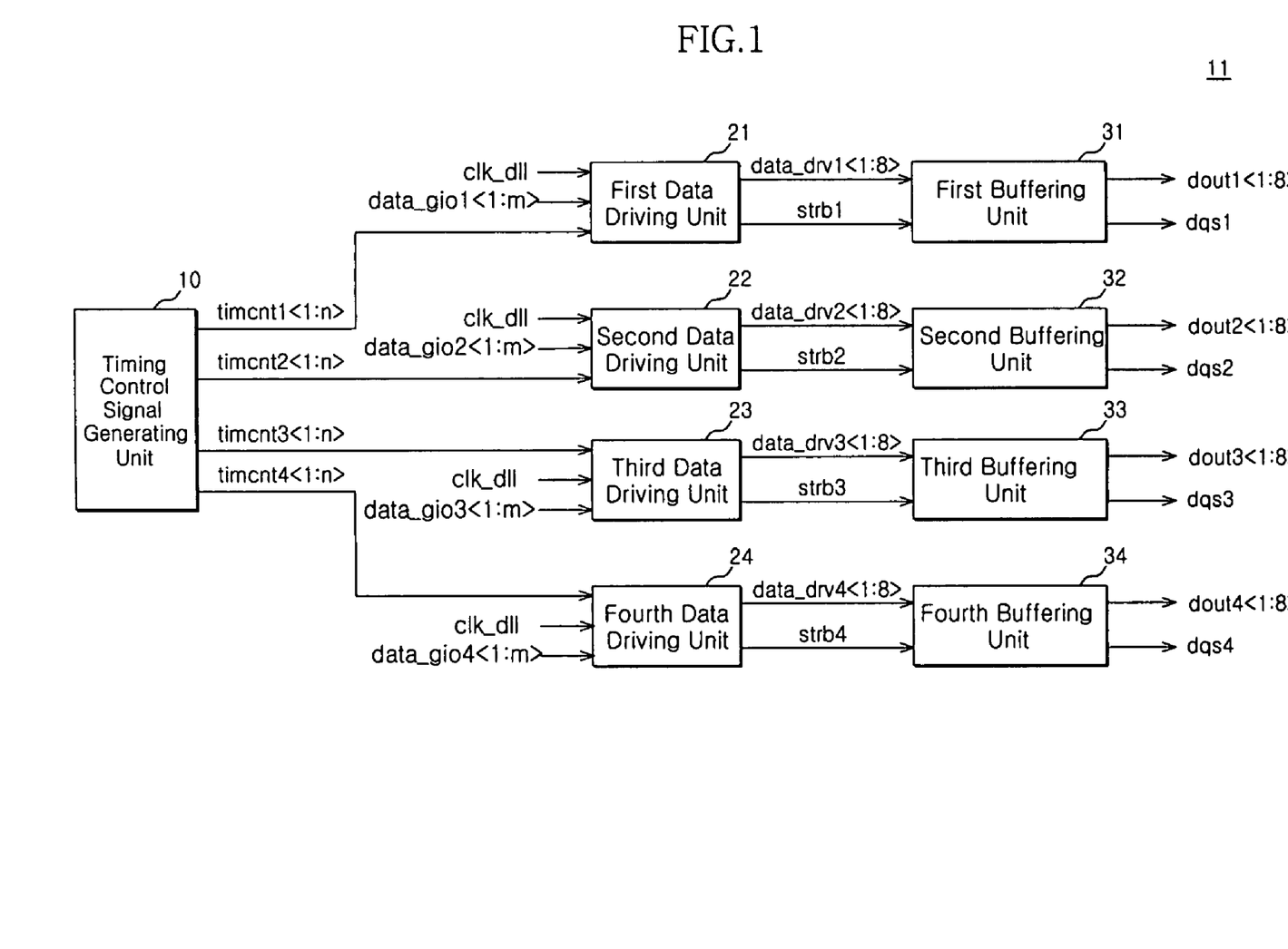
FIG. 1 is a block diagram illustrating the configuration of a data output circuit in a semiconductor memory apparatus according to one embodiment.

FIG. 1 is a block diagram illustrating one configuration of a data output circuit 11 in a semiconductor memory apparatus according to one embodiment, in which the exemplary data output circuit 11 has four circuits for driving and buffering data by 8 bits. It should be understood that the data output circuit shown in the figures herein are for exemplarily purposes.

As shown in FIG. 1, the data output circuit 11 can include a timing control signal generating unit 10, a first data driving unit 21, a second data driving unit 22, a third data driving unit 23, a fourth data driving unit 24, a first buffering unit 31, a second buffering unit 32, a third buffering unit 33, and a fourth buffering unit 34.

The timing control signal generating unit 10 can generate first to fourth timing control signals "timcnt1<1:n>" to "timcnt4<1:n>". The first to fourth timing control signals "timcnt1<1:n>" to "timcnt4<1:n>" are implemented by n bits of a digital signal, respectively and can be set to have different logic values. For example, the first to fourth timing control signals "timcnt1<1:n>" to "timcnt4<1:n>" can include a signal having a first logic value (hereafter, logic value 1) at different positions. According to circumstances, two pairs of the first to fourth timing control signals "timcnt1<1:n>" to "timcnt4<1:n>" may have the same logic value. The logic values of the first to fourth timing control signals "timcnt1<1:n>" to "timcnt4<1:n>" depend on the amount of power noise to be reduced.

The first data driving unit 21 can generate a first driving data "data_drv1<1:8>" and a first strobe signal "strb1" from a DLL clock signal "clk_dll" and a first global line data (hereafter, first GIO data signal "data_gio<1:m>"), in response to the first timing control signal "timcnt<1:n>". The second data driving unit 22 can generate a second driving data "data_drv2<1:8>" and a second strobe signal "strb2" from the DLL clock signal "clk_dll" and a second global line data (hereafter second GIO data signal "data_gio2<1:m>"), in response to the second timing control signal "timcnt2<1:n>". The third data driving unit 23 can generate a third driving data "data_drv3<1:8>" and a third strobe signal "strb3" from the DLL clock signal "clk_dll" and a third global line data (hereafter, third GIO data signal "data_gio3<1:m>"), in response to the third timing control signal "timcnt3<1:n>". The fourth data driving unit 24 can generate a fourth driving data "data_drv4<1:8>" and a fourth strobe signal "strb4" from the DLL clock signal "clk_dll" and a fourth global line data (hereafter, fourth GIO data signal "data_gio4<1:m>", in response to the fourth timing control signal "timcnt4<1:n>".

The first buffering unit 31 can generate a first output data signal "dout<1:8>" and a first data output strobe clock signal "dqs1" by buffering the first driving data signal "data_drv1<1:8>" and the first strobe signal "strb1". The second buffering unit 32 can generate a second output data signal "dout2<1:8>" and a second data output strobe clock signal "dqs2" by buffering the second driving data signal "data_drv2<1:8>" and the second strobe signal "strb2". The third buffering unit 33 can generate a third output data signal "dout3<1:8>" and a third data output strobe clock signal "dqs3" by buffering the third driving data signal "data_drv3<1:8>" and the third strobe signal "strb3". The fourth buffering unit 34 can generate a fourth output data signal "dout4<1:8>" and a fourth data output strobe clock signal "dqs4" by buffering the fourth driving data signal "data_drv4<1:8>" and the fourth strobe signal "strb4".

In such an embodiment, the DLL clock signal "clk_dll" can be exemplified as an internal clock signal of the semiconductor memory apparatus. However, the DLL clock signal "clk_dll" is only an example and it should be understood that the internal clock signal can be achieved from any clock signal that can be used in the semiconductor memory apparatus. The DLL clock signal "clk_dll", e.g., a clock signal that is output from a clock signal generating device, such as a DLL (Delay Locked Loop) circuit, can include a rising clock signal having an enabling interval at a rising edge of an external clock signal "clk_ext" and a falling clock signal having an enabling interval at a falling edge timing of the external clock signal.

The first to fourth GIO data signals "data_gio1<1:m>" to "data_gio4<1:m>" are data signals respectively transmitted from m global lines GIO. When the first to fourth data driving units 21 to 24 respectively output data four times, the first to fourth GIO data signals "data_gio1<1:m>" to "data_gio4<1:m>" are respectively composed of thirty two data bits. That is, the first to fourth data driving units 21 to 24 output the first to fourth driving data signals "data_drv1<1:8>" to "data_drv4<1:8>", which are each respectively composed of eight data bits, four separate times. The first to fourth data driving units 21 to 24 respectively output the first to fourth driving data signals "data_drv1<1:8>" to "data_drv4<1:8>" at different times, in response to the first to fourth timing control signals "timcnt1<1:n>" to "timcnt4<1:n>". The first to fourth data driving units 21 to 24 respectively output the first to fourth strobe signals "strb1" to "strb4" at different times, in response to the first to fourth timing control signals "timcnt1<1:n>" to "timcnt4<1:n>".

Though not shown in detail, the first to fourth buffering units 31 to 34 each have eight data buffers and one data strobe clock signal buffer and output, four times, the first to fourth output data signals "dout1<1:8>" to "dout4<1:8>" that are each composed of eight data bits, respectively. Because the timing related to when the first to fourth driving data signals "data_drv1<1:8>" to "data_drv4<1:8>" are transmitted to the first to the fourth buffering units 31 to 34 is different, the buffering timing of the first to fourth output data "dout1<1:8>" to "dout4<1:8>" can be different for each buffering unit. Further, the buffering timing of the first to fourth data output strobe clock signals "dqs1" to "dqs4" can also be different for each buffering unit.

That is, the data output circuit does not simultaneously output data and assigns a different driving timing to each group of eight driving data signals and one strobe signal. Further, the data output circuit can assign different output timing to each group of eight output data signals and one data output strobe clock signal. Therefore, peak current in the data output circuit can be reduced and a power noise can be prevented, or at least significantly reduced.

Figure 2:
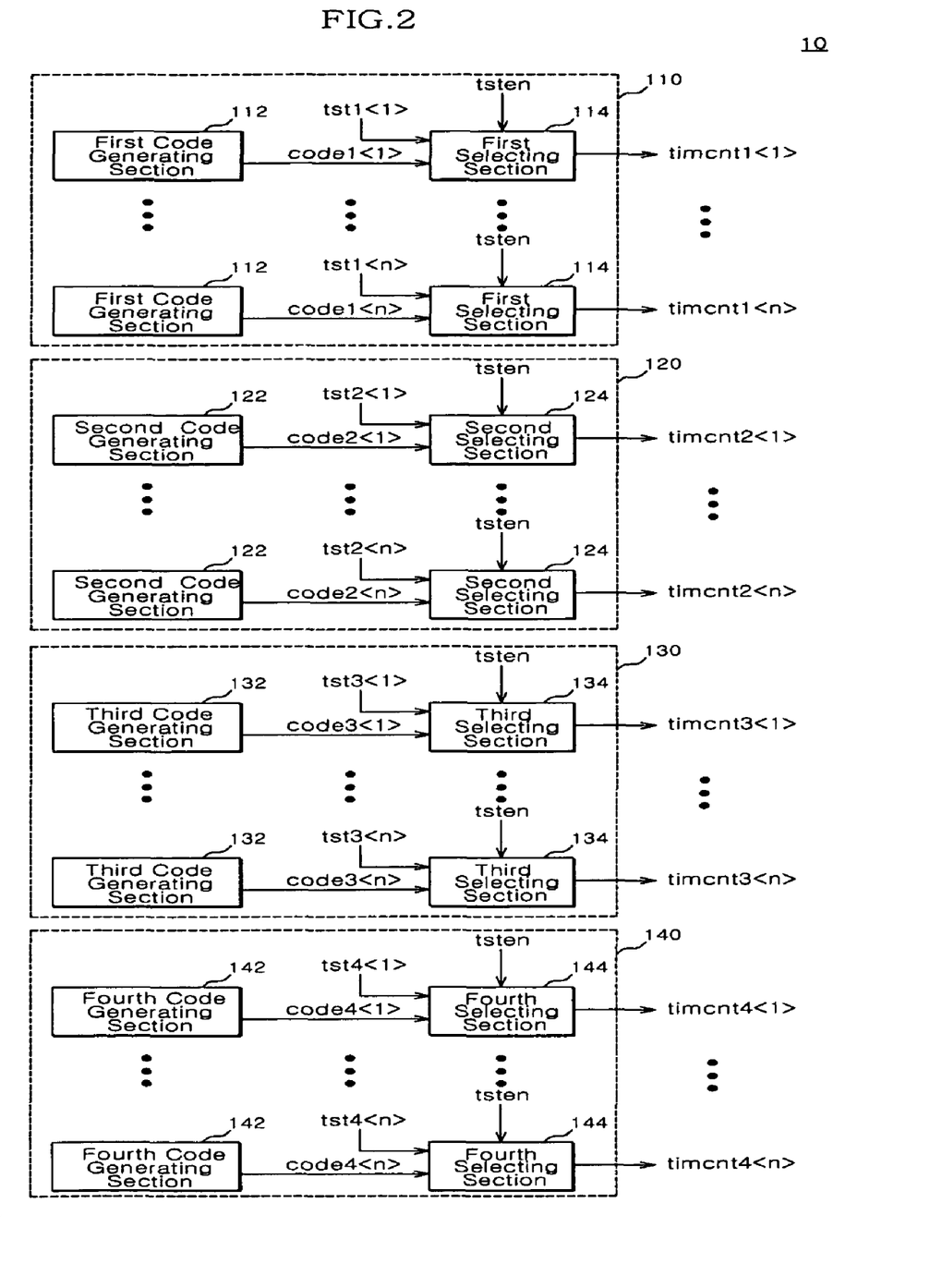
FIG. 2 is a diagram illustrating in detail a timing control signal generating unit that can be included in the circuit illustrated in FIG. 1.

Referring to FIG. 2, the timing control signal generating unit 10 can include a first signal generating section 110, a second signal generating section 120, a third signal generating section 130, and a fourth signal generating section 140.

The first signal generating section 110 can generate a first timing control signal "timcnt1<1:n>" in response to signals set by fuse circuits or register circuits, or n first test signals "tst1<1:n>". The first signal generating section 110 can include n first code generating sections 112 that each have a fuse circuit or a register circuit and generate n first code signals "code1<1:n>", and n first selectors 114 that can selectively output the n first code signals "code1<1:n>" or the n first test signals "tst1<1:n>" as the first timing control signal "timcnt1<1:n>" in response to a test enabling signal "tsten".

The second signal generating section 120 can generate the second timing control signal "timcnt2<1:n>" in response to signals set by fuse circuits or register circuits, or n second test signals "tst2<1:n>". The second signal generating section 120 can include n second code generating sections 122 that have a fuse circuit of a register circuit and generate n second code signals "code2<1:n>", and n second selectors 124 that can selectively output the n second code signals "code2<1:n>" or the n second test signals "tst2<1:n>" as the second timing control signal "timcnt2<1:n>" in response to the test enabling signal "tsten".

The third signal generating section 130 can generate the third timing control signal "timcnt3<1:n>" in response to signals set by fuse circuits or register circuits, or n third test signals "tst3<1:n>". The third signal generating section 130 can include n third code generating sections 132 that each have a fuse circuit or a register circuit and generate n third code signals "code3<1:n>", and n third selectors 134 that can selectively output the n third code signals "code3<1:n>" or the n third test signals "tst3<1:n>" as the third timing control signal "timcnt3<1:n>" in response to the test enabling signal "tsten".

The fourth signal generating section 140 can generate the fourth timing control signal "timcnt4<1:n>" in response to signals set by fuse circuits or register circuits, or n fourth test signals "tst4<1:n>". The fourth signal generating section 140 can include n fourth code generating sections 142 that each have a fuse circuit or a register circuit and generate n fourth code signals "code4<1:n>", and n fourth selectors 144 that can selectively output the n fourth code signals "code4<1:n>" or the n fourth test signals "tst4<1:n>" as the fourth timing control signal "timcnt4<1:n>" in response to the test enabling signal "tsten".

In a timing control signal generating unit 10 having the above configuration, after the test is started, the test enabling signal "tsten" is enabled and the first to fourth test signals "tst1<1:n>" to "sts4<1:n>" are respectively output as the first to fourth timing control signals "timcnt1<1:n>" to "timcnt4<1:n>".

When the test is finished, the test enabling signal "tsten" is disabled, and the first to fourth code signals "code1<1:n>" to "code4<1:n>" are respectively output as the first to fourth timing control signals "timcnt1<1:n>" to "timcnt4<1:n>".

As described above, the first to fourth timing control signals "timcnt1<1:n>" to "timcnt4<1:n>" can be generated by the forcible control of the timing control signal generating unit 10. That is, by setting different the logic values of the first the fourth timing control signals "timcnt1<1:n>" to "timcnt4<1:n>", the first to fourth output data signals "dout1<1:8>" to "dout4<1:8>" can be output with different timing. Further, by giving the same logic values to two pairs of the first to fourth timing control signals "timcnt1<1:n>" to "timcnt4<1:n>", two pairs of the first to fourth output data signals "dout1<1:8>" to "dout4<1:8>" can be output with the same timing.

Figure 3:
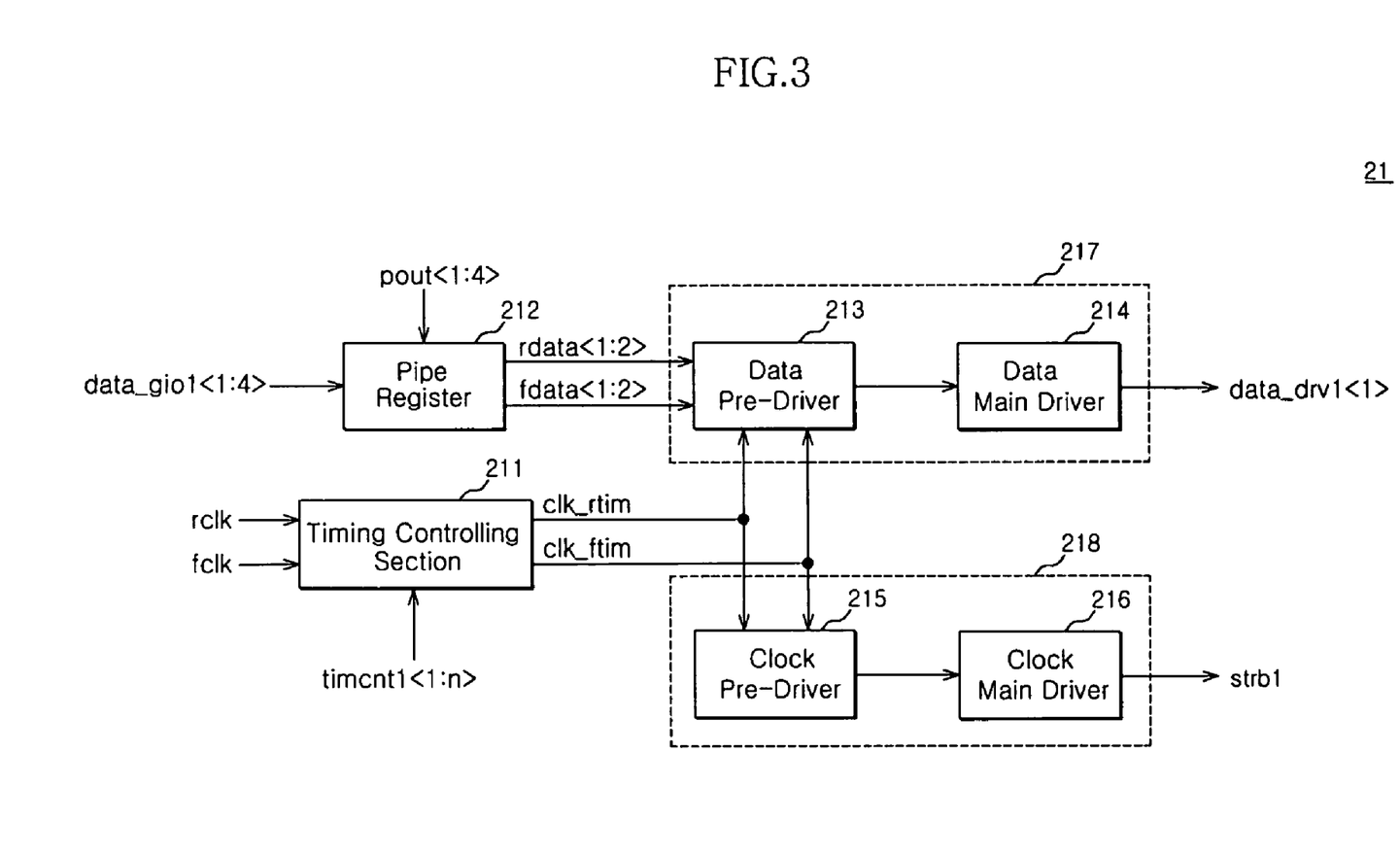
FIG. 3 is a diagram illustrating in detail a first data driving unit that can be included in the circuit illustrated in FIG. 1.

FIG. 3 is a diagram illustrating in detail the first data driving unit shown in FIG. 1 according to one embodiment. Referring to FIG. 3, for the ease of illustration, the first data driving unit is considered to be representative of the second to fourth data driving units. The configuration shown in the figure relates to a part that receives four data bits "data_gio1<1:4>" in the m first GIO data bits "data_gio1<1:m>" and outputs one bit "data_drv1<1>" of the first driving data signal "data_drv1<1:8>".

As shown in FIG. 3, the first data driving unit 21 can include a timing controlling section 211, a pipe register 212, a data pre-driver 213, a data main driver 214, a clock signal pre-driver 215, and a clock signal main driver 216.

The timing controlling section 211 can generate a rising timing control clock signal "clk_rtim" and a falling timing control clock signal "clk_ftim" by controlling the rising clock signal "rclk" and the falling clock signal "fclk", in response to the first timing control signal "timcnt1<1:n>".

The pipe register 212 can simultaneously latch four data bits "data_gio1<1:4>" in the first GIO data signal "data_gio1<1:m>" and alternately output, one bit at a time, rising data bits "rdata<1:2>" and falling data bits "fdata<1:2>" of the latched data, in response to four pipe output control bits "pout<1:4>" that can be sequentially enabled.

The data pre-driver 213 sequentially drives, one bit at a time, the rising data bits "rdata<1:2>" and the falling data bits "fdata<1:2>", in response to the rising timing control clock signal "clk_rtim" and the falling timing control clock signal "clk_ftim".

The data main driver 214 can generate one bit "data_drv1<1>" of the first driving data signal "data_drv1<1:8>" by driving data output from the data pre-driver 213.

The clock signal pre-driver 215 can drive the rising timing control clock signal "clk_rtim" and the falling timing control clock signal "clk-ftim".

The clock signal main driver 216 can generate the first strobe signal "strb1" by driving an output signal of the clock signal pre-driver 215.

The first data driving unit, described above, can have one pipe register 212, one data pre-driver 213 and one data main driver 214, but the first data driving unit 21 will, in this embodiment, be provided with eight pipe registers 212, data pre-drivers 213, and data main drivers 214, respectively. On the other hand, one timing controlling section 211, clock signal pre-driver 215, and clock signal main driver 216 are provided, respectively. The data pre-driver 213 and the data main driver 214 can collectively be called a data driver 217 and the clock signal pre-driver 215 and the clock signal main driver 216 can collectively be called a clock signal driver 218. That is, the data driver 217 can generate one bit "data_drv1<1>" of the first driving data signal "data_drv1<1:8>" by sequentially driving, one bit at a time, the rising data bits "rdata<1:2>" and the falling data bits "fdata<1:2>", in response to the rising timing control clock signal "clk_rtim" and the falling timing control clock signal "clk_ftim".

The clock signal driver 218 can generate the first strobe signal "strb1" by driving the rising timing control clock signal "clk_rtim" and the falling timing control clock signal "clk_ftim".

The pipe register 212 can simultaneously latch four first GIO data bits "data_gio<1:4>" simultaneously input and alternately output, one bit at a time, the rising data bits "rdata<1:2>" and the falling data bits "fdata<1:2>". Thereafter, the data pre-driver 213 can drive the rising data bits "rdata<1:2>" and the falling data bits "fdata<1:2>" that are alternately input one bit at a time, in response to the rising timing control clock signal "clk_rtim" and the falling timing control clock signal "clk_ftim". The clock signal pre-driver 215 can drive the rising timing control clock signal "clk_rtim" and the falling timing control clock signal "clk_ftim".

The rising timing control clock signal "clk_rtim" and the falling timing control clock signal "clk_ftim" are clock signals output from the timing controlling section 211 and delayed for a predetermined time with respect to the rising clock signal "rclk" and the falling clock signal "fclk".

The data pre-driver 213 and the clock signal pre-driver 215 operate in synchronization with the rising timing control clock signal "clk_rtim" and the falling timing control clock signal "clk_ftim". Therefore, the driving timings of the data pre-driver 213 and the clock signal pre-driver 215 depend on the toggle timing of the rising timing control clock signal "clk_rtim" and the falling timing control clock signal "clk_ftim", respectively. The driving timings of the data main driver 214 and the clock signal main driver 216 can depend on the input timings of data and clock signal, respectively, i.e. the driving timings of the data pre-driver 213 and the clock signal pre-driver 215. As a result, the data main driver 214 and the clock signal main driver 216 have driving timings that depend on the toggle timing of the rising timing control clock signal "clk_rtim" and the falling timing control clock signal "clk_ftim", respectively. Accordingly, the buffering timing of the first buffering unit 31 that receives the first driving data signal "data_drv1<1:8>" and the first strobe signal "strb1" from the first data driving unit 21 also depends on the toggle timings of the rising timing control clock signal "clk_rtim" and the falling timing control clock signal "clk_ftim".

As described above, the first to fourth timing control signals "timcnt1<1:n>" to "timcnt4<1:n>" can have different logic values and accordingly the rising timing control clock signal "clk_rtim" and the falling timing control clock signal "clk_ftim" in the first to fourth data driving units 21 to 24 can have different toggle timings. When the rising timing control clock signal "clk_rtim" and the falling timing control clock signal "clk_ftim" in the first to fourth data driving units 21 to 24 have different toggle timings, the first to fourth data driving units 21 to 24 can operate at different timings and the first to fourth buffering units 31 to 34 correspondingly operate at different timings. Therefore, the data output circuit does not simultaneously output data for each data bit and outputs data in a plurality of bit units at different times, such that the amount of peak current is reduced and the power noise is prevented. The logic values of the first to fourth timing control signals "timcnt1<1:n>" to "timcnt4<1:n>" can be set to vary, according to the amount of the peak current and the power noise that is tolerable for a particular implementation, and may give the same values to two timing control signals.

Figure 4:
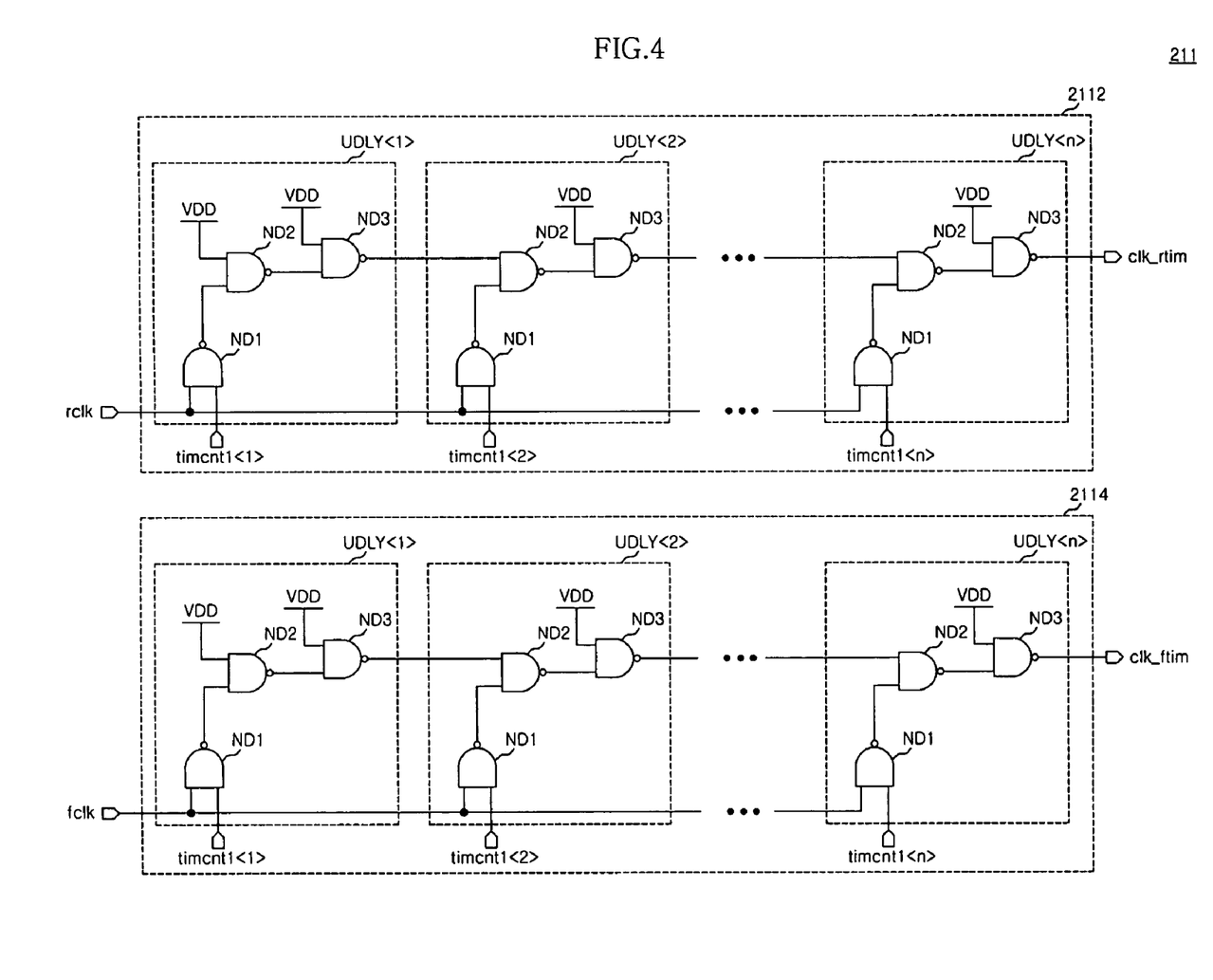
FIG. 4 is a diagram illustrating in detail a timing controlling section that can be included in the circuit illustrated in FIG. 3.

Referring to FIG. 4, the timing controlling section 211 can include a rising timing control section 2112 that can generate the rising timing control clock signal "clk_rtim" by delaying the rising clock signal "rclk" in response to the first timing control signal "timcnt1<1:n>"; and a falling timing control section 2114 that can generate the falling timing control clock signal "clk_ftim" by delaying the falling clock signal "fclk" in response to the first timing control signal "timcnt1<1:n>".

The rising timing control section 2112 can include n unit delays "UDLY<1:n>" that delay signals transmitted from the previous stage, in response to each bit included in the first timing control signal "timcnt1<1:n>". Each of the unit delay "UDLY<1:n>" can include first to third NAND gates "ND1" to "ND3".

The first NAND gate "ND1" can receive the rising clock signal "rclk" and any one bit included in the first timing control signal "timcnt1<1:n>". The second NAND gate "ND2" receives an output signal of the first NAND gate "ND1" and a signal transmitted from a unit delay at the previous delay. The third NAND gate "ND3" receives an output signal of the second NAND gate "ND2" and an external power source voltage VDD.

In certain embodiments, the second NAND gate "ND2" of the unit delay "UDLY<1>" at the first step can receive the external power source voltage VDD, instead of an output signal of the unit delay at the previous step. The third NAND gate "ND3" of the unit delay "UDLY<n>" at the final step can output the rising timing control clock signal "clk_rtim".

The falling timing control section 2114 can have the same configuration as the rising timing control section 2112, but is different in that it can receive the falling clock signal "fclk" instead of the rising clock signal "rclk" and output the falling timing control clock signal "clk_ftim" instead of the rising timing control clock signal "clk_rtim". For simplicity and ease of illustration, the configuration of the falling timing control section 2114 is not described below.

Only one bit having the logic value of 1 is included in the first timing control signal "timcnt1<1:n>". Therefore, the number of delay elements that the rising clock signal "rclk" or the falling clock signal "fclk" passes is determined according to that the bit having the logic value of 1 is at which bit. Therefore, the toggle timing of the rising timing control clock signal "clk_rtim" or the falling timing control "clock signal clk_ftim" is determined in this manner.

The first to fourth timing control signals "timcnt1<1:n>" to "timcnt4<1:n>" can include the bit having the logic value of 1, at different locations, in which the toggle timing of the rising timing control clock signal "clk_rtim" and the falling timing control clock signal "clk_ftim" used in the first to fourth data driving units 21 to 24 may be different and the operational timings of the first to fourth data driving units 21 to 24 and the first to fourth buffering units 31 to 34 may be different, respectively.

Figure 5:
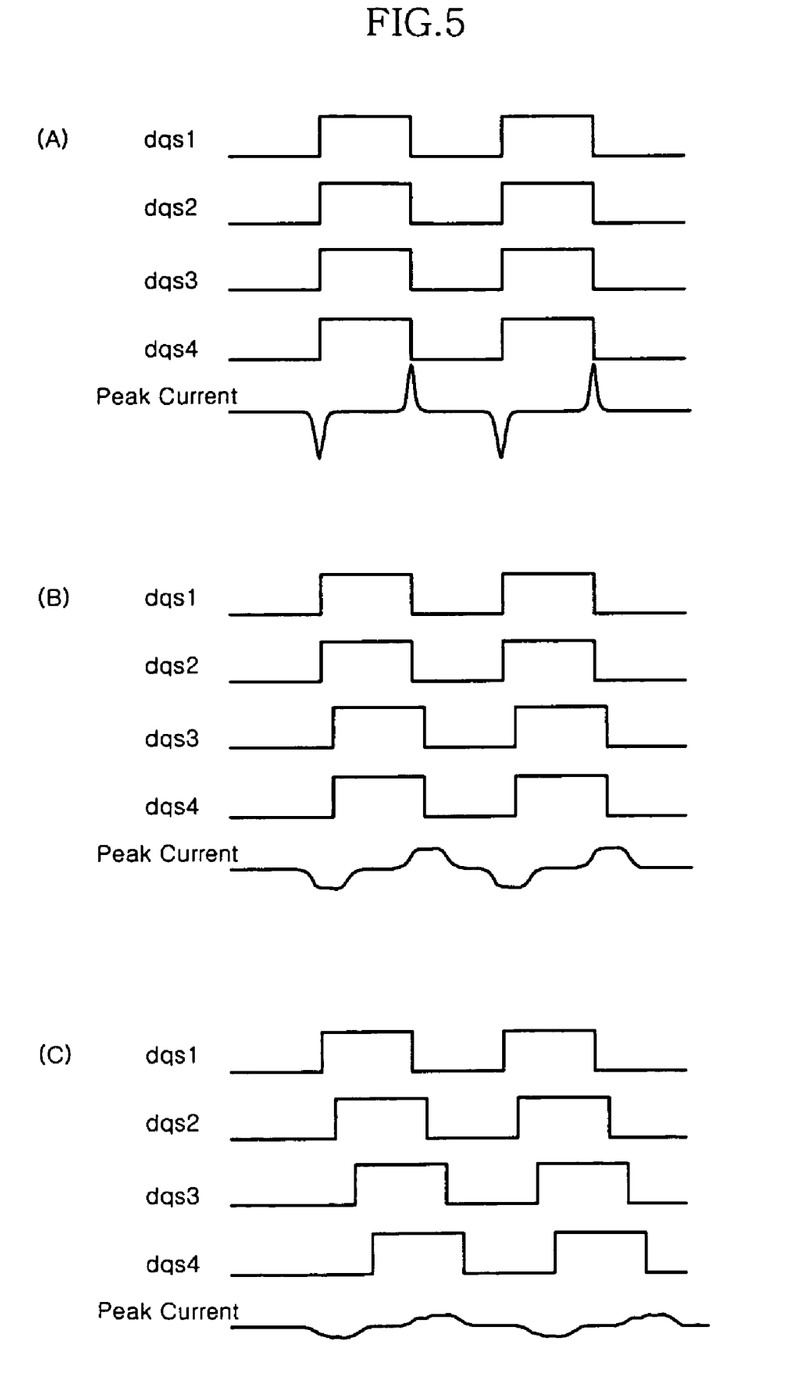
FIG. 5 is a timing chart illustrating the operation of a data output circuit in a semiconductor memory apparatus according to one embodiment.

The amount of peak current is shown in FIG. 5 for a conventional circuit along with the first to fourth data output strobe clock signals "dqs1" to "dqs4" when all of the first to fourth timing control signals "timcnt1<1:n>" to "timcnt4<1:n>" have the same logic values (A).

The first to fourth data output strobe clock signals "dqs1" to "dqs4" and the amount of peak current corresponding to the clock signals when two of the first to fourth timing control signals "timcnt1<1:n>" to "timcnt4<1:n>" each have the same logic value (B) and when the first to fourth timing control signals "timcnt1<1:n>" to "timcnt4<1:n>" have different logic values, as in the embodiments described herein, are also shown in FIG. 5. As shown in the figure, the amount of peak current in the data output circuit is less when the first to fourth timing control signals "timcnt1<1:n>" to "timcnt4<1:n>" have different logic values as in the embodiments described herein. Moreover, it would be expected that the power noise will also be less in such embodiments.

As described above, a data output circuit configured in accordance with the embodiments described herein can divide data output from the global line into some units and give different driving and buffering timings to each unit, such that it is possible to reduce the amount of peak current generated in outputting data and prevent, or limit power noise. Therefore, it is possible to reduce the entire power noise of the associated semiconductor memory apparatus and increase the power efficiency, such that it is possible to effectively support achieving a semiconductor memory apparatus that can be operated at low power.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data output circuit in a semiconductor memory apparatus comprising:
    a first data driving unit configured to generate a first driving data signal with a first timing;
    a first buffering unit configured to generate a first output data signal by buffering the first driving data signal;
    a second data driving unit configured to generate a second driving data signal with a second timing that is different from the first timing; and
    a second buffering unit configured to generate a second output data signal by buffering the second driving data signal;
    wherein an output timing of the first output data signal is determined by an input timing of the first driving data signal as it enters the first buffering unit, and an output timing of the second output data signal is determined by an input timing of the second driving data signal as it enters the second buffering unit.

2. The data output circuit of claim 1, further comprising:

a timing control signal generating unit configured to define the first timing of the first data driving unit by generating a first timing control signal and to define the second timing of the second data driving unit by generating a second timing control signal.

3. The data output circuit of claim 2, wherein the first data driving unit comprises:
a timing controlling section configured to generate a rising timing control clock signal and a falling timing control clock signal by controlling timings of a rising clock signal and a falling clock signal in response to the first timing control signal;
a pipe register configured to latch a first global line data signal and to output a rising data signal and a falling data signal in response to a pipe output control signal;
a data pre-driver configured to sequentially drive, one bit at a time, the rising data signal and the falling data signal, in response to the rising timing control clock signal and the falling timing control clock signal; and
a data main driver configured to generate the first driving data signal by driving a data output from the data pre-driver.

4. The data output circuit of claim 2, wherein the second data driving unit comprises:
a timing controlling section configured to generate a rising timing control clock signal and a falling timing control clock signal by controlling timings of a rising clock signal and a falling clock signal in response to the second timing control signal;
a pipe register configured to latch a second global line data signal and to output a rising data signal and a falling data signal in response to a pipe output control signal;
a data pre-driver configured to sequentially drive, one bit at a time, the rising data signal and the falling data signal, in response to the rising timing control clock signal and the falling timing control clock signal; and
a data main driver configured to generate the second driving data signal by driving data output from the data pre-driver.

5. A data output circuit in a semiconductor memory apparatus comprising:
a timing control signal generating unit configured to generate first and second timing control signals;
a first data driving unit configured to generate a first driving data signal, using an internal clock signal and a first global line data signal, in response to the first timing control signal;
a first buffering unit configured to generate a first output data signal by buffering the first driving data signal;
a second data driving unit configured to generate a second driving data signal, using the internal clock signal and a second global line data signal, in response to the second timing control signal; and
a second buffering unit configured to generate a second output data signal by buffering the second driving data signal.

6. The data output circuit of claim 5, wherein the timing control unit is configured to generate the first and second timing control signals that are each a digital signal having a plurality of bits and have different logic values each other.

7. The data output circuit of claim 6, wherein the timing control unit comprises:
a first signal generating section configured to generate the first timing control signal in response to a signal set by a fuse circuit or a register circuit, or a first test signal; and
a second signal generating section configured to generate the second timing control signal in response to a signal set by a fuse circuit or a register circuit, or a second test signal.

8. The data output circuit of claim 5, wherein the first and second data driving units are configured to output the first and second driving data signals at different timings each other in response to the first and second timing control signals.

9. The data output circuit of claim 8, wherein the first data driving unit further comprises a circuit configured to generate a first strobe signal using the internal clock signal in response to the first timing control signal, and the second data driving unit further comprises a circuit configured to generate a second strobe signal using the internal clock signal in response to the second timing control signal.

10. The data output circuit of claim 9, wherein the first and second data driving units are configured to output the first and second strobe signals at different timings each other in response to the first and second timing control signals.

11. The data output circuit of claim 9, wherein the first buffering unit further comprises a circuit configured to generate a first data output strobe clock signal by buffering the first strobe signal, and the second buffering unit further comprises a circuit configured to generate a second data output strobe clock signal by buffering the second strobe signal.

12. The data output circuit of claim 9, wherein the internal clock signal includes a rising clock signal and a falling clock signal, and the first data driving unit comprises:
a timing controlling section configured to generate a rising timing control clock signal and a falling timing control clock signal by controlling timings of the rising clock signal and the falling clock signal in response to the first timing control signal;
a pipe register configured to latch a first global line data signal and to output a rising data signal and a falling data signal in response to a pipe output control signal;
a data pre-driver configured to sequentially drive, one bit at time, the rising data signal and the falling data signal, in response to the rising timing control clock signal and the falling timing control clock signal;
a data main driver configured to generate the first driving data signal by driving a data output from the data pre-driver;
a clock signal pre-driver configured to drive the rising timing control clock signal and the falling timing control clock signal; and
a clock signal main driver configured to generate the first strobe signal by driving an output signal of the clock signal pre-driver.

13. The data output circuit of claim 12, wherein the timing controlling section comprises:
a rising timing control section configured to generate the rising timing control clock signal by delaying the rising clock signal in response to the first timing control signal; and
a falling timing control section configured to generate the falling timing control clock signal by delaying the falling clock signal in response to the first timing control signal.

14. The data output circuit of claim 9, wherein the internal clock signal includes a rising clock signal and a falling clock signal, and
the second data driving unit comprises:
a timing controlling section configured to generate a rising timing control clock signal and a falling timing control clock signal by controlling the timing of the rising clock signal and the falling clock signal in response to the second timing control signal;

a pipe register configured to latch a second global line data and to output a rising data signal and a falling data signal in response to a pipe output control signal;

a data pre-driver configured to sequentially drive, one bit at a time, the rising data signal and the falling data signal, in response to the rising timing control clock signal and the falling timing control clock signal;

a data main driver configured to generate the second driving data signal by driving a data output from the data pre-driver;

a clock signal pre-driver configured to drive the rising timing control clock signal and the falling timing control clock signal; and a clock signal main driver configured to generate the second strobe signal by driving an output signal of the clock signal pre-driver.

15. The data output circuit of claim 14, wherein the timing controlling section comprises:

a rising timing control section configured to generate the rising timing control clock signal by delaying the rising clock signal in response to the second timing control signal; and a falling timing control section configured to generate the falling timing control clock signal by delaying the falling clock signal in response to the second timing control signal.

16. The data output circuit of claim 5, wherein output timings of the first output data signal and the first data output strobe clock signal are determined by input timings of the first driving data signal and the first strobe signal into the first buffering unit, and output timings of the second output data signal and the second data output strobe clock signal are determined by input timings of the second driving data signal and the second strobe signal into the second buffering unit.

17. A data output circuit in a semiconductor memory apparatus comprising:

a timing control signal generating unit configured to generate a timing control signal having a plurality of bits;

a timing controlling section configured to generate a timing control clock signal by controlling a timing of an internal clock signal in response to the timing control signal; and a data driver configured to generate a driving data signal by sequentially driving, one bit at time, a data signal having a plurality of bits, in response to the timing control clock signal.

18. The data output circuit of claim 17, wherein the timing control unit comprises:

a code generating section configured to have a fuse circuit or a register circuit and to generate a code signal; and a selector configured to selectively output, as the timing control signal, the code signal or a test signal, in response to a test enabling signal.

19. The data output circuit of claim 17, wherein the timing control signal is formed of a combination of a plurality of signals including one signal having a first logic value, and wherein the timing controlling section includes a plurality of unit delayers configured to delay a signal transmitted from a previous stage in response to each signal included in the timing control signal.

20. The data output circuit of claim 17, further comprising:

a pipe register configured to latch a global line data signal and to output the data having a plurality of bits input into the data driver, in response to a pipe output control signal.

21. The data output circuit of claim 17, wherein the data driver comprises:

a data pre-driver configured to sequentially drive, one bit at a time, the data having a plurality of bits, in response to the timing control clock signal; and a data main driver configured to generate the driving data signal by driving an output data signal of the pre-driver.

22. The data output circuit of claim 17, further comprising:

a clock signal driver configured to generate a strobe signal by driving the internal clock signal.

23. The data output circuit of claim 22, wherein the clock signal driver comprises:

a clock signal pre-driver configured to drive the internal clock signal; and a clock signal main driver configured to generate the strobe signal by driving an output signal of the clock signal pre-driver.

24. The data output circuit of claim 22, further comprising:

a buffering unit configured to generate an output data signal and a data output strobe clock signal by buffering the driving data signal and the strobe signal, respectively.

* * * * *